United States Patent
Ishikawa et al.

(10) Patent No.: US 10,618,286 B2
(45) Date of Patent: Apr. 14, 2020

(54) MANUFACTURING METHOD FOR STRUCTURE AND MANUFACTURING METHOD FOR LIQUID EJECTING HEAD

(71) Applicant: CANON KABUSHIKI KAISHA, Tokyo (JP)

(72) Inventors: Tetsushi Ishikawa, Tokyo (JP); Yasuaki Tominaga, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 329 days.

(21) Appl. No.: 15/218,263

(22) Filed: Jul. 25, 2016

(65) Prior Publication Data

US 2017/0036447 A1 Feb. 9, 2017

(30) Foreign Application Priority Data

Aug. 5, 2015 (JP) .................................. 2015-155167

(51) Int. Cl.
*B41J 2/16* (2006.01)
*B41J 2/14* (2006.01)
(Continued)

(52) U.S. Cl.
CPC ......... *B41J 2/1631* (2013.01); *B41J 2/14145* (2013.01); *B41J 2/1603* (2013.01);
(Continued)

(58) Field of Classification Search
CPC .... B41J 2/14145; B41J 2/1603; B41J 2/1623; B41J 2/1628; B41J 2/1631; B41J 2/1637;
(Continued)

(56) References Cited

U.S. PATENT DOCUMENTS 4,424,659 A * 1/1984 Perigo .................. B65B 31/028
426/129
4,838,008 A 6/1989 Hardy
(Continued)

FOREIGN PATENT DOCUMENTS

JP 54-053092 A 4/1979
JP 63-138904 A 6/1988
(Continued)

OTHER PUBLICATIONS

Notification of Reasons for Refusal in Japanese Application No. 2015-155167 (dated Apr. 16, 2019).

*Primary Examiner* — A. Dexter Tugbang
(74) *Attorney, Agent, or Firm* — Venable LLP

(57) ABSTRACT

In a structure such as a liquid ejecting head configured to cover an opening of a base with a covering member, the present invention alleviates the generation of a warp on the structure or the base even if the covering member is hardened and shrunk. The structure includes the base and the covering member attached onto the base. A manufacturing method for the structure includes: a first step of attaching the covering member having flexibility onto the base in such a manner as to cover an opening of the hole formed at the base and a second step of hardening the covering member attached onto the base. In the first step, the covering member is attached onto the base in a state in which a non-stuck portion of the covering member, covering the opening of the base, is slack.

8 Claims, 7 Drawing Sheets

(51) Int. Cl.
  *B65B 31/02*    (2006.01)
  *H01H 13/702*   (2006.01)
  *B29C 33/00*    (2006.01)
  *H05K 3/28*     (2006.01)
  *H05K 3/00*     (2006.01)

(52) U.S. Cl.
  CPC ........... *B41J 2/1623* (2013.01); *B41J 2/1628* (2013.01); *B41J 2/1637* (2013.01); *B41J 2/1645* (2013.01); *B65B 31/025* (2013.01); *B65B 31/028* (2013.01); *B29C 33/0038* (2013.01); *H01H 13/702* (2013.01); *H05K 3/0094* (2013.01); *H05K 3/287* (2013.01); *Y10T 29/49373* (2015.01); *Y10T 29/49401* (2015.01)

(58) Field of Classification Search
  CPC .............. B41J 2/1645; Y10T 29/49373; Y10T 29/49401; H01H 13/702; B29C 33/0038; H05K 3/0094; H05K 3/287; B65B 3/025; B65B 3/028; B65B 31/025; B65B 31/028
  See application file for complete search history.

(56) References Cited

U.S. PATENT DOCUMENTS

| | | | | |
|---|---|---|---|---|
| 5,340,956 | A  * | 8/1994  | Chen ................. | H01H 13/702 200/341 |
| 5,356,755 | A  * | 10/1994 | Matsuda ............. | H05K 3/0094 216/18 |
| 6,049,158 | A  * | 4/2000  | Takeuchi ............ | B41J 2/1623 310/324 |
| 6,247,232 | B1 * | 6/2001  | Lambert ............. | Y10T 29/49373 29/890.043 |
| 7,416,629 | B2   | 8/2008  | Silverbrook et al. | |
| 7,469,987 | B2   | 12/2008 | Silverbrook et al. | |
| 7,571,541 | B2   | 8/2009  | Silverbrook et al. | |
| 7,736,458 | B2   | 6/2010  | Silverbrook et al. | |
| 7,776,175 | B2   | 8/2010  | Silverbrook et al. | |
| 8,087,168 | B2   | 1/2012  | Silverbrook et al. | |
| 8,308,273 | B2   | 11/2012 | Silverbrook et al. | |
| 2008/0031996 | A1 * | 2/2008 | Mamada ............ | B29C 33/0038 425/546 |
| 2008/0266351 | A1  | 10/2008 | Silverbrook et al. | |
| 2009/0102882 | A1  | 4/2009  | Silverbrook et al. | |
| 2010/0078407 | A1  | 4/2010  | Lebens et al. | |
| 2012/0308838 | A1 * | 12/2012 | Ito .................... | H05K 3/287 428/446 |

FOREIGN PATENT DOCUMENTS

| | | | |
|---|---|---|---|
| JP | 2006-315271 A | 11/2006 | |
| JP | 2008-526553 A | 7/2008 | |
| JP | 2012218232 A | * 11/2012 | .......... B41J 2/14233 |
| WO | 2006/072127 A2 | 7/2006 | |

* cited by examiner

MANUFACTURING METHOD FOR STRUCTURE AND MANUFACTURING METHOD FOR LIQUID EJECTING HEAD

BACKGROUND OF THE INVENTION

Field of the Invention

The present invention relates to a manufacturing method for a structure and a manufacturing method for a liquid ejecting head for ejecting liquid.

Description of the Related Art

A printing apparatus (i.e., a liquid ejecting apparatus) using an ink jet system is designed to eject droplets of ink (i.e., print liquid) from an ejection port formed at a liquid ejecting head, allow the droplets of ink to adhere to a print medium, and thus achieve printing. In general, a liquid ejecting head for use in an ink jet apparatus is provided with a silicon substrate having electric wiring, an energy generating element for generating energy for ejecting ink, and the like formed thereon. The silicon substrate has thereon a channel, on which an air bubble is generated by the energy generating element, a fine ejection port, through which the droplets of ink are ejected, and an ink supply port, through which ink is supplied to the channel communicating with the ejection port.

Japanese Patent Laid-Open No. 2008-526553 discloses a liquid ejecting head for ejecting ink from an ejection port in the above-described manner. In this liquid ejecting head, between an ink supply conduit tube and the liquid ejecting head, a polymeric film obtained by processing a channel manifold with a laser beam is attached to a support member via an adhesive layer, and ink is supplied to an ink supply port through a channel member formed of the polymeric film.

SUMMARY OF THE INVENTION

A first aspect of the present invention is directed to a manufacturing method for a structure including a base having a hole formed thereon and a covering member stuck onto the base, the manufacturing method including: a first step of sticking the covering member having flexibility onto the base in such a manner as to cover an opening of the hole; and a second step of hardening the covering member stuck onto the base, wherein in the first step, the covering member is stuck onto the base in a state in which a non-stuck portion of the covering member covering the opening of the base is warped.

A second aspect of the present invention is directed to a manufacturing method for a liquid ejecting head including a substrate provided with an ejection energy generating element for generating energy for ejecting liquid, a liquid supply port, and a liquid chamber, and furthermore, including a channel communicating with the liquid supply port and an ejection port forming member having an ejection port communicating with the channel formed thereon, the manufacturing method including: a first step of sticking a covering member having flexibility onto the substrate in such a manner as to cover an opening of the liquid chamber; and a second step of hardening the covering member stuck onto the substrate, wherein in the first step, the covering member is stuck onto the substrate in a state in which a non-stuck portion of the covering member, covering the opening of the substrate, is warped.

Further features of the present invention will become apparent from the following description of exemplary embodiments (with reference to the attached drawings).

DESCRIPTION OF THE EMBODIMENTS

As disclosed in Japanese Patent Laid-Open No. 2008-526553, in the case of a structure in which the polymeric film is processed with a laser beam to be attached to the support member, there is a tendency of the difficulty in achieving high precision and high density. In view of this, in order to easily achieve high precision and high density, there has been known a technique in which a common liquid chamber formed on the reverse of a silicon substrate is tented with a photosensitive dry film resist, and then, a liquid inlet, through which liquid is introduced, is formed by photolithography.

However, in a system in which an opening of the common liquid chamber is tented with the dry film resist, a partition wall of a channel is pulled by a hardening shrinkage force of the dry film resist, thereby possibly causing a warp on a substrate or a warp on the entire liquid ejecting head.

Embodiments of the present invention will be described below with reference to the attached drawings. In the following description, a structure manufactured by a manufacturing method of the present invention is exemplified by a liquid ejecting head shown in FIG. 1 and FIG. 2.

Figure 1:
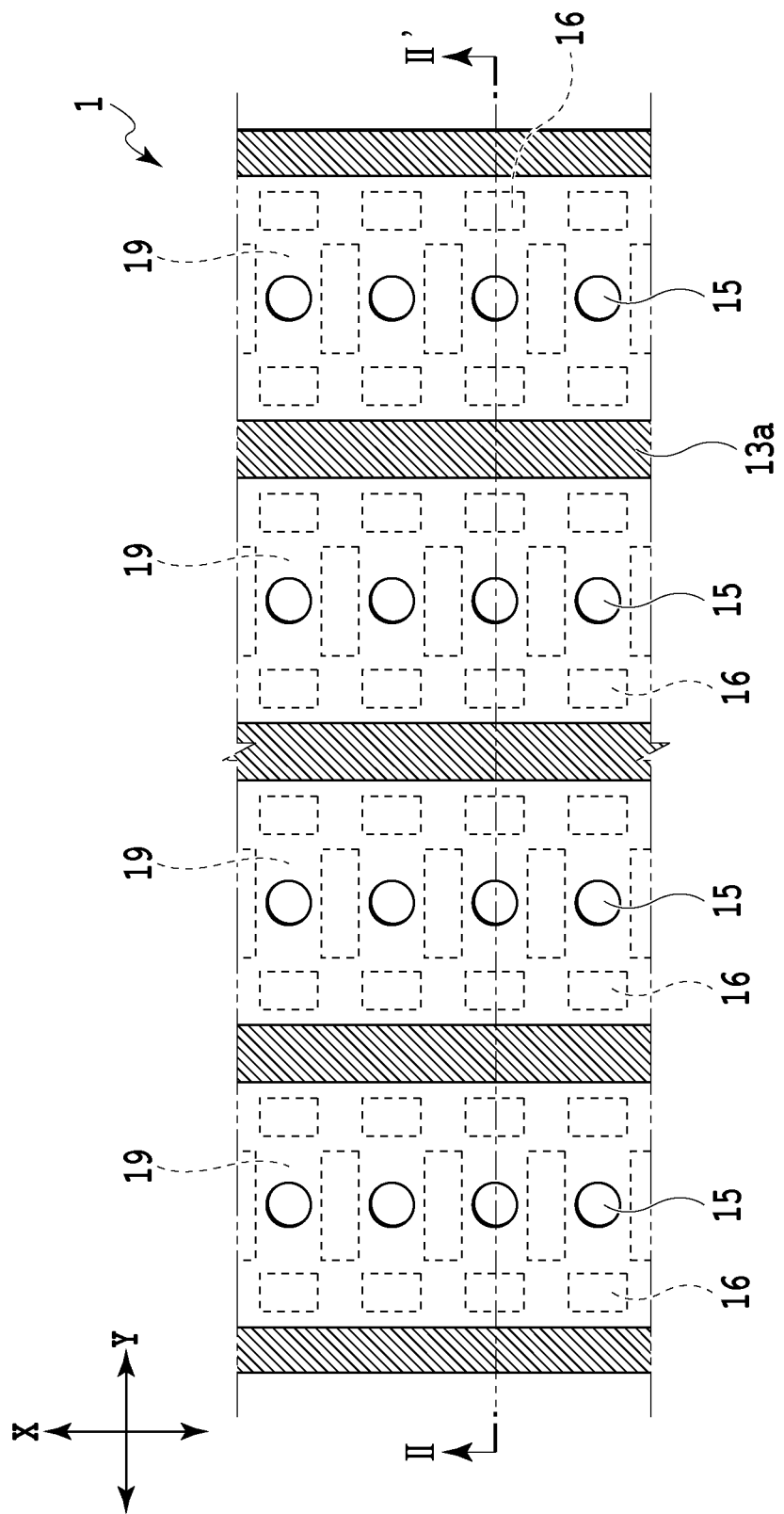
FIG. 1 is a view schematically showing a part of a liquid ejecting head manufactured in embodiments of the present invention.

Here, a description will be given of the configuration of a liquid ejecting head to be formed by the manufacturing method in the embodiments of the present invention with reference to FIG. 1 and FIG. 2. FIG. 1 is a view schematically showing a part of a liquid ejecting head to be manufactured in the present embodiments, and specifically, showing a state observed from a surface (i.e., an ejection surface) at which ejection ports of the liquid ejecting head are formed. Moreover, FIG. 2 is a cross-sectional view showing the liquid ejecting head shown in FIG. 1, taken along a line II-II'.

Figure 2:
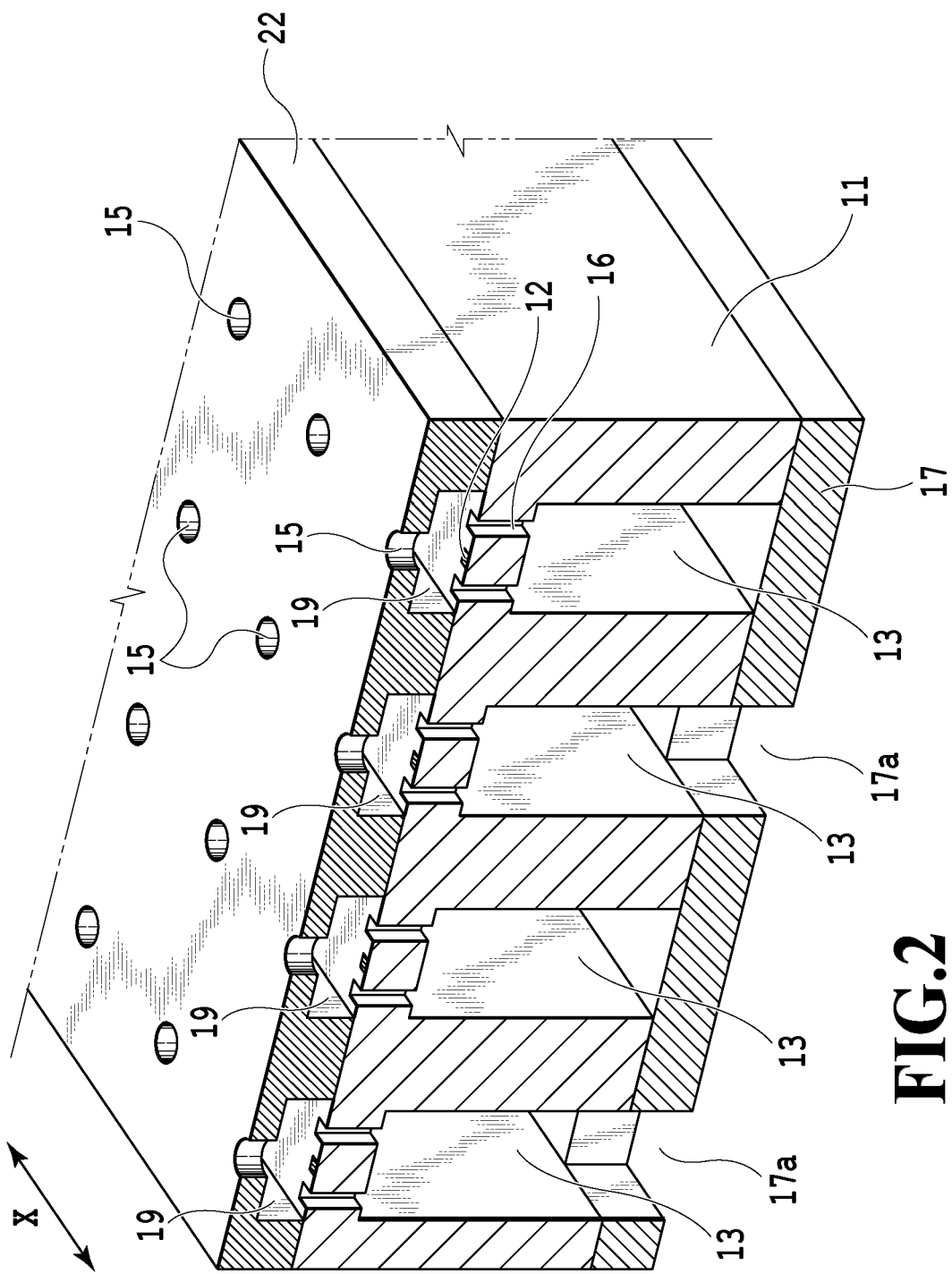
FIG. 2 is a schematic cross-sectional view showing the liquid ejecting head shown in FIG. 1, taken along a line II-II'.

In FIG. 1 and FIG. 2, a liquid ejecting head 1 includes: a substrate (i.e., a base) 11 made of silicon or the like; an ejection port forming member 22 disposed at the bottom (i.e., an upper surface in FIG. 2) that is one surface of the substrate 11; and a liquid chamber covering member (i.e., a covering member) 17 disposed at the other surface of the substrate 11. At the ejection port forming member 22, a plurality of ejection ports 15 for ejecting liquid are arranged at a predetermined pitch in a predetermined direction (i.e., an X direction), thus constituting ejection port arrays. In the present embodiment, a plurality of ejection port arrays parallel to each other are formed at a predetermined interval in a direction perpendicular to the X direction (i.e., a Y direction).

Between the ejection port forming member 22 and the substrate 11 welded to the ejection port forming member are formed a plurality of channels 19 in a manner corresponding to the ejection ports 15, respectively. Moreover, in the substrate 11, a common liquid chamber (i.e., a liquid chamber) 13 extending in the array direction of the ejection ports 15 (i.e., the X direction) is formed in a manner corresponding to each of the ejection port arrays. In the present embodiment, four ejection port arrays are formed, and therefore, four common liquid chambers 13 are formed in a manner corresponding to the four ejection port arrays, respectively. Each of the common liquid chambers 13 communicates with the channel 19 via a liquid supply port 16 formed at the substrate 11.

At the bottom (the upper surface in FIG. 2) that is one surface of the substrate 11, a plurality of ejection energy generating elements 12 for generating ejection energy for use in ejecting liquid are formed at a predetermined interval in such a manner as to face the ejection ports 15, respectively. Furthermore, the liquid chamber covering member 17 includes a liquid inlet 17a, through which liquid reserved in a liquid reservoir tank or the like, not shown, disposed outside of the liquid ejecting head 1 is introduced into the common liquid chamber (i.e., the liquid chamber) 13.

In the liquid ejecting head 1 configured as described above, the liquid flowing into the common liquid chamber 13 from the liquid reservoir tank through the liquid inlet 17a is supplied to the channel 19 through the liquid supply port 16, so that the ejection port 15 is filled with the liquid. Here, energy generated by driving the ejection energy generating element 12 produces an air bubble in the liquid supplied into the channel 19, and thus, the liquid staying in the ejection port 15 is ejected to the outside in the form of a droplet under the pressure of the air bubble. The ejection energy generating element 12 is exemplified by a heater element and a piezoelectric element.

(First Embodiment)

Next, a manufacturing method for the liquid ejecting head 1 having the above-described configuration in a first embodiment of the present invention will be explained with reference to FIGS. 3A to 3G, 4A, 4B, 5A, and 5B.

Figure 3A:
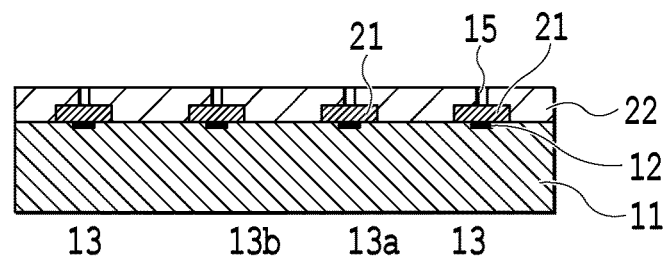
FIGS. 3A to 3G are schematic cross-sectional views showing the manufacturing steps of the liquid ejecting head in a first embodiment.
Figure 3B:
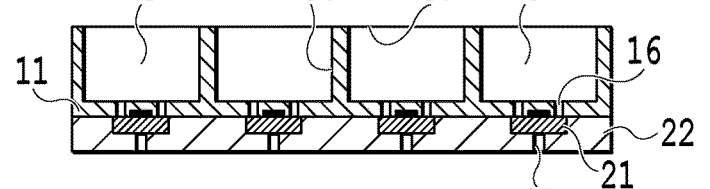

First, a pattern 21 that is a die for forming the channel 19 (i.e., a channel forming die) is formed at the bottom (i.e., an upper surface in FIG. 3A) of the substrate 11 having the ejection energy generating element 12 formed thereon by using a positive photosensitive resin layer. Subsequently, the ejection port forming member 22 for forming the ejection port 15 for ejecting the liquid is formed by using a negative photosensitive resin layer (FIG. 3A). And then, a plurality of holes 13 and the plurality of liquid supply ports 16 are formed at the obverse of the substrate 11 (i.e., a lower surface in FIG. 3A or an upper surface in FIG. 3B) by techniques of photolithography and Si (silicon) deep etching (FIG. 3B). The plurality of holes 13 serve as the aforementioned common liquid chambers, from which the liquid is supplied to each of the plurality of ejection port arrays. Here, according to the present invention, the hole is not limited to a space formed through the base (or the substrate) but it includes a space that does not penetrate the substrate such as a cavity or a recess.

Figure 3C:
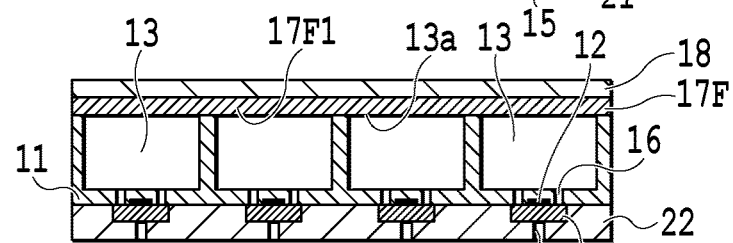

Next, the liquid chamber covering member 17 is stuck onto the substrate 11 in such a manner as to cover an opening 13a of the common liquid chamber 13. The formation of the liquid chamber covering member 17 is achieved by attaching a dry film resist (hereinafter referred to as a dry film) 17F covering a base film 18 onto the bottom of the substrate 11 by a laminator. In this manner, the openings 13a of the common liquid chambers 13, serving as the holes formed at the substrate 11, are covered (i.e., tented) with the base film 18 and the dry film 17F (FIG. 3C). A chemical amplification type negative photosensitive resin containing a photoacid generator, for example, is used as the material of the dry film 17F. Moreover, films made of PET, polyimide, and hydrocarbon may be used as the base film 18. Therefore, any films 17F and any base films 18 have flexibility.

Subsequently, the base film 18 is peeled off (FIG. 3D), and then, the substrate 11 is irradiated with an exposure light 40 via a mask 31 having a light-shielding portions and a translucent portion (FIG. 3E), followed by post-baking and developing in sequence. In this manner, portions of the dry film 17F, irradiated with the exposure light 40, are hardened and remains while portions shielded from the exposure light 40 are removed (FIG. 3F). The portions, from which the dry film 17F is removed, serve as liquid inlets 17a formed at the liquid chamber covering member 17. Thereafter, the channel forming dies 21 are removed so that the channel 19 communicating with the ejection ports 15 are formed, followed by curing. The liquid ejecting head 1 having the configuration shown in FIG. 1 is manufactured in the above-described manner (FIG. 3G).

In the above-described manufacturing steps, the tenting (i.e., a first step) shown in FIG. 3C is performed by mounting the substrate 11 on a heated stage in the laminator and moving the substrate 11 while pressing the substrate 11 against the dry film 17F by a heated roller (i.e., a pressing member). Consequently, portions in the dry film 17F, positioned on the substrate 11, come into a state attached onto the substrate 11 whereas portions covering the openings 13a, that is, portions 17F1 that are not brought into contact with the substrate 11 serve as non-stuck portion that are not stuck onto the substrate 11. In the present embodiment, before the exposure to the light, as shown in FIG. 3D, the substrate 11 is tented with the dry film 17F in a state in which the non-attached portion 17F1 are sufficiently recessed inward of the common liquid chambers 13, that is, are slack.

Figure 4A:
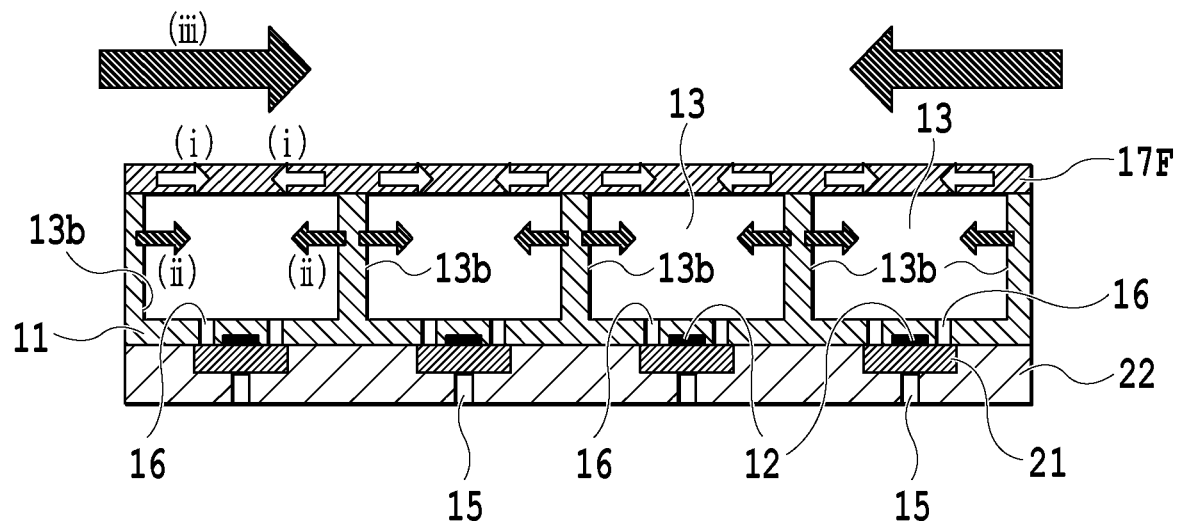
FIGS. 4A and 4B are schematic cross-sectional views showing the function of hardening shrinkage of a dry resist film.

The dry film 17F disposed at the upper end of the common liquid chambers 13 are shrunk, as indicated by (i) in FIG. 4A, in the exposing step (i.e., a second step) for hardening the dry film 17F. In a case where the slack of each of the non-attached portions 17F1 of the dry film 17F is smaller than the each of non-attached portions shrinkage of the dry film 17F, stress acts in a direction in which each of partition walls 13b is pulled, as indicated by (ii) in FIG. 4A, and therefore, bending moment is applied to each of the partition walls 13b. Under the influence of the bending moments, the upper portion of the liquid ejecting head 1 is pulled, as indicated by (iii) in FIG. 4A. As a consequence, in a case where the ejection port 15 faces downward, a downward warp is formed at the liquid ejecting head 1, and accordingly, the ejection port forming member 22 also is warped downward. The warp formed at the ejection port forming member 22 makes an error in an ejection direction of a droplet to be ejected from the ejection port 15. Therefore, in a case where the liquid ejection head 1 is used in an ink jet printing apparatus, the landing position of the droplet onto a print medium or the like is shifted, thereby possibly degrading an image.

Figure 3D:
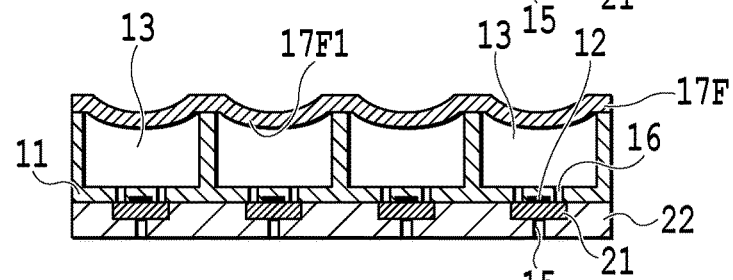
Figure 4B:
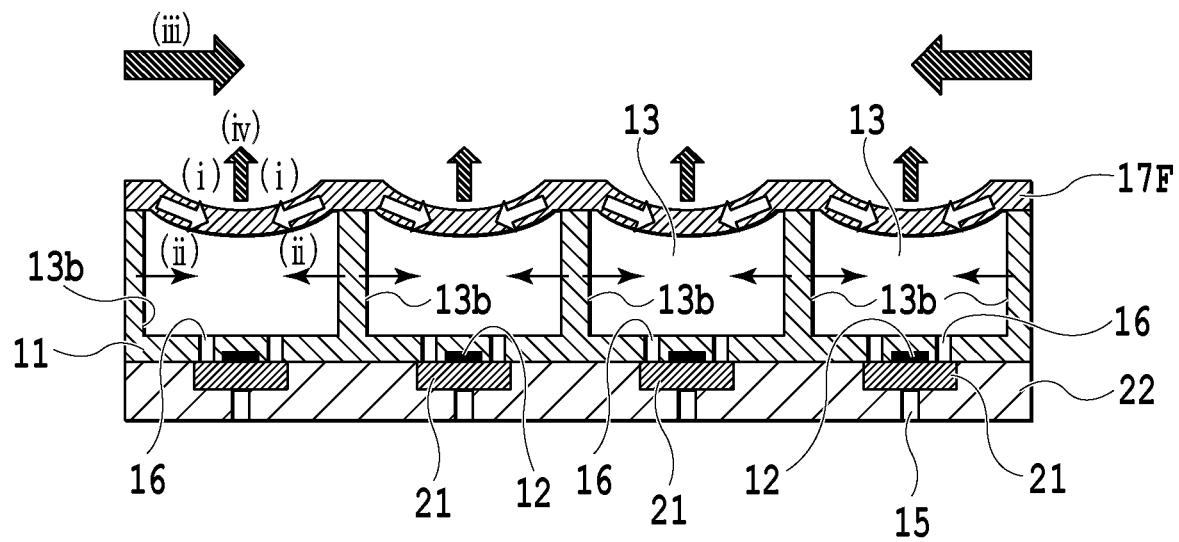

In contrast, in the present embodiment, as shown in FIG. 3D and FIG. 4B, before the exposure, the non-attached portions 17F1 of the tenting dry film 17F is sufficiently slacked inward of the common liquid chambers 13. Here, in the present specification, the slack state of the dry film 17F signifies a non-planar state in which no stress is generated. Since the non-attached portions 17F1 of the dry film 17F come into the sufficiently slack state, even if hardening and shrinkage indicated by (i) occurs at the non-stuck portion 17F1 caused by the exposure, the shrinkage is absorbed by the warp of the dry film 17F, as indicated by (iv). Thus, the pulling force (ii) with respect to each of the partition walls 13b each of the common liquid chambers 13 is alleviated, thus reducing the bending moment to be exerted on each of the partition walls 13b. As a consequence, the warp of the liquid ejecting head 1 is alleviated, as indicated by (iii) in FIG. 4B, thereby alleviating the warp of the ejection port forming member 22.

Figure 5A:
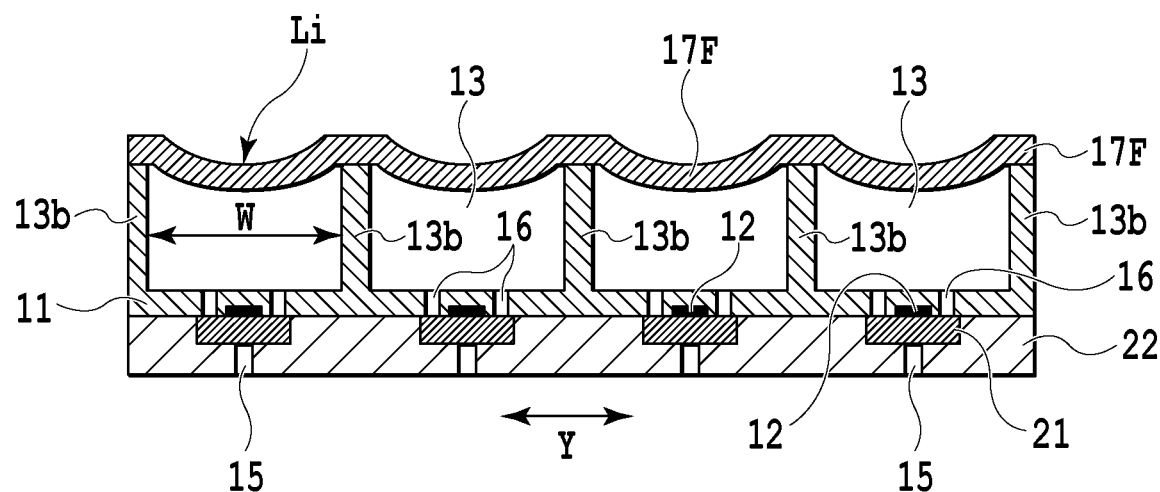
FIGS. 5A and 5B are schematic cross-sectional views showing the behavior of the dry resist film in the first embodiment.
Figure 5B:
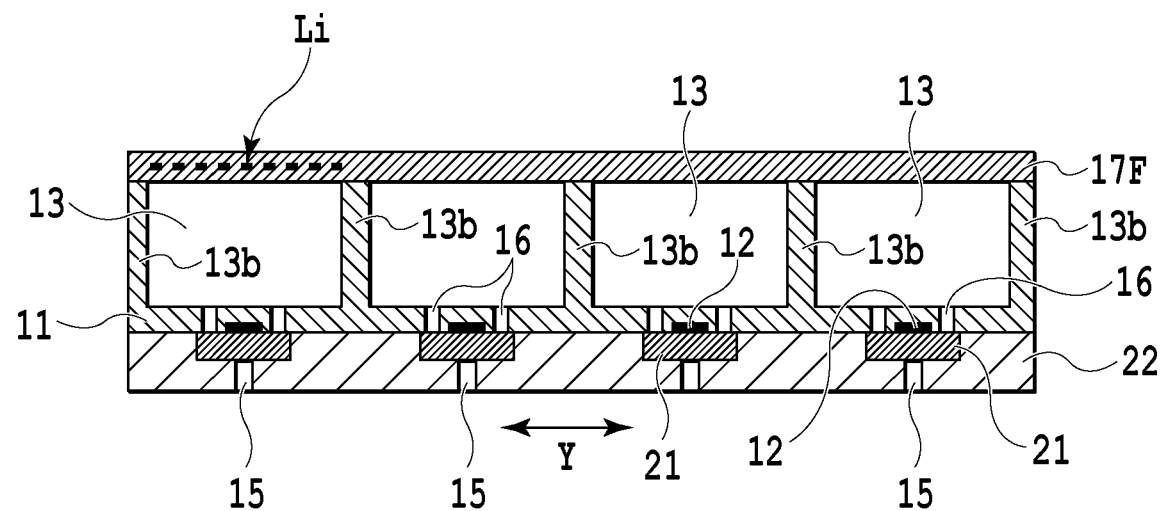

FIG. 5A is a schematic cross-sectional view showing one example of a state before hardening and shrinkage of the tenting dry film 17F in the present embodiment; and FIG. 5B is a schematic cross-sectional view showing one example of a state after the hardening and shrinkage of the dry film 17F.

For the above-described reason, each of the non-stuck portions 17F1 of the dry film 17F is slacked inward of the common liquid chambers 13 until the hardening and shrinkage by the exposure. Therefore, in a case where reference character W designates the width of each of the common liquid chambers 13 (i.e., a length in the Y direction); Li, a length (i.e., an initial neutral line length) between the partition walls 13b of the tenting dry film 17F before the exposure to the light beam; and α, the rate of hardening shrinkage of the dry film 17F, the initial neutral line length Li is set to be greater than the width W of the common liquid chamber 13. Specifically, the initial neutral line length Li is set to satisfy the following relationship:

$$W < (1-\alpha) \times Li \quad \text{(Formula 1)}$$

Here, in consideration of the adhesiveness between the liquid ejecting head 1 and the support member after the exposure and development steps, it is desirable that the dry film 17F should be planar after hardening. Specifically, it is preferable that the initial neutral line length Li should be set to satisfy the following relationship:

$$W = (1-\alpha) \times Li \quad \text{(Formula 2)}$$

Here, since the thickness of the adhesive layer, via which the support member and the dry film 17F adhere to each other, is several tens of micrometers, no problem arises with the adhesiveness between the dry film 17F and the support member even if the dry film 17F is recessed to some extent. As a consequence, there arises no problem in a case where the maximum of the initial neutral line length Li is about 1.2 times the width W.

A technique for slacking the non-stuck portion 17F1 of the dry film 17F inward of the common liquid chamber 13 during tenting is exemplified by a method for setting temperature environment during tenting. For example, there is a method for setting the temperature of the stage and the temperature of the roller higher than a softening temperature of a material forming a dry film to be used. In this case, it is preferable that the pressure of the roller should be high whereas the movement speed of the roller should be low. For example, the temperature of the roller is set within a temperature range from 40° C. to 80° C., the pressure of the roller is set from 0.1 MPa to 0.5 MPa, and the movement speed of the roller is set from 1 mm/s to 10 mm/s, followed by tenting.

Moreover, in tenting, in a case where the spaces inside of the common liquid chambers 13 are closed, air heated in tenting is confined in the space to be then cooled down to room temperature, and thus, the capacity of the space is reduced by cooling and shrinkage. Therefore, the non-stuck portion 17F1 of the dry film 17F can be slacked inward of the common liquid chamber 13. Therefore, it is desirable that the space of the common liquid chamber should be closed. The closed space can be formed by tenting the substrate 1 with the dry film 17F before the channel forming die 21 is removed. According to other techniques, the channel forming die 21 is removed to form the channel 19, and then, a layer is formed at a surface of the ejection port forming member 22, at which the ejection port 15 is formed, with a protecting tape or the like so as to close the ejection port 15, thus obtaining the closed space.

In addition to the formation of the inside of the common liquid chamber 13 into the closed space, tenting in environment of a pressure lower than the atmospheric pressure can change the dry film 17F in a direction in which the dry film 17F is recessed inward of the common liquid chamber 13 owing to a difference in pressure in a case where the pressure is returned to the atmospheric pressure.

In the present embodiment, after the substrate 1 is tented with the dry film 17F, the base film 18 is peeled off from the dry film 17F before the irradiation with the exposure light 40, as shown in FIG. 3D. As a consequence, the dry film 17F is not supported by the base film 18, and therefore, the dry film 17F is easily recessed inward of the common liquid chamber 13.

As described above, since the non-attached portion 17F1 of the dry film 17F is slacked inward of the common liquid chamber 13 in the substrate 11 during tenting in the first embodiment, it is possible to alleviate the warp of the substrate 11 or the liquid ejecting head 1 even if hardening and shrinkage are caused in the exposing step.

(Second Embodiment)

Next, a description will be given of a second embodiment of the present invention. In the second embodiment as well, explanation will be made by way of a method for manufacturing the liquid ejecting head 1 shown in FIG. 1 and FIG. 2 as a structure.

FIGS. 6A to 6G are schematic cross-sectional views showing the manufacturing steps of a liquid ejecting head 1 in the second embodiment. In the second embodiment as well, like the first embodiment, patterns 21 serving as channel forming dies and an ejection port forming member 22 are formed at the bottom of a substrate 11, and thereafter, a liquid supply ports 16 and a common liquid chambers 13 are formed.

Figure 6A:
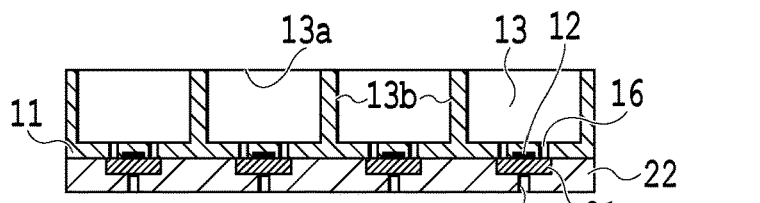
FIGS. 6A to 6G are schematic cross-sectional views showing the manufacturing steps of a liquid ejecting head in a second embodiment.
Figure 6B:
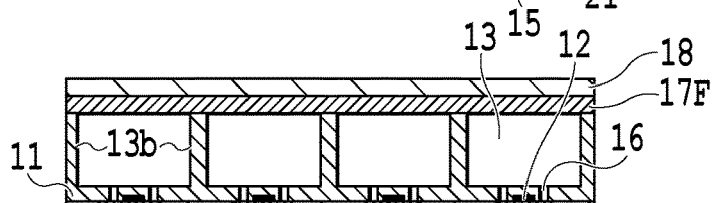

Subsequently, a liquid chamber covering members having liquid inlets 17a, formed therein, for introducing liquid to the common liquid chambers 13 are formed. In the second embodiment as well, the formation of the liquid chamber covering member 17 is achieved by attaching a dry film 17F covering a base film 18 onto the bottom of the substrate 11 by a laminator. In this manner, an opening of the common liquid chamber 13 is tented with the dry film 17F (FIG. 6B). Here, the material of the dry film 17 is the same as that in the first embodiment.

Figure 6C:
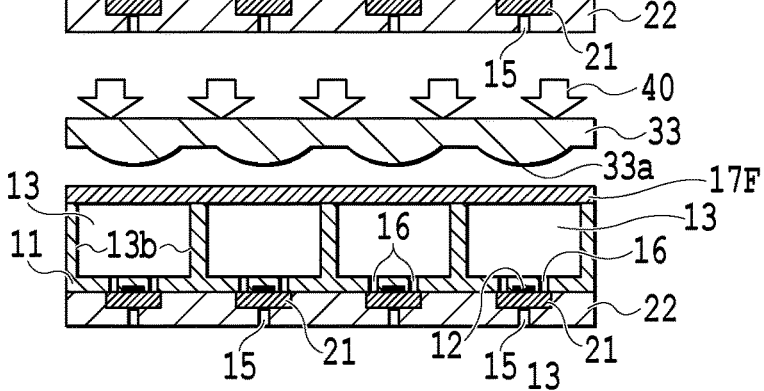
Figure 6D:
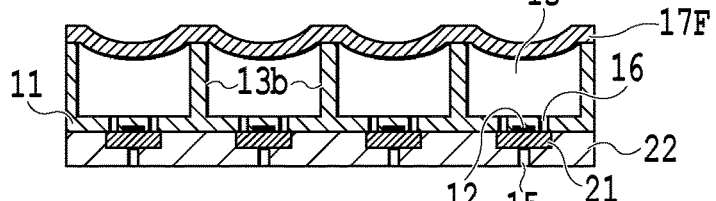
Figure 6E:
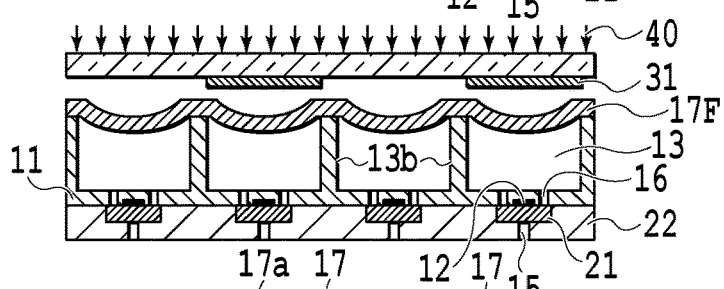
Figure 6F:
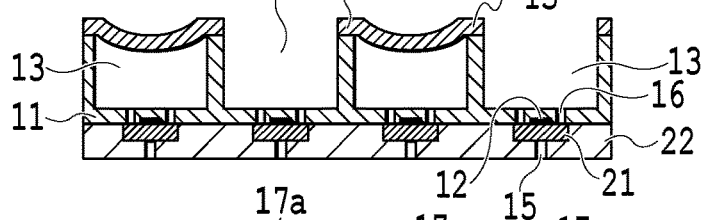

Next, pressing is performed by peeling off the base film 18 and pushing the dry film 17 into each of the common liquid chambers 13 by the use of a mold 33 (FIG. 6C). The mold 33 has a plurality of projections 33a located at positions corresponding to the common liquid chambers 13 formed on the substrate 11, respectively. Pressing the projections 33a of the mold 33 against the dry film 17 forcibly recesses the dry film 17F stuck onto the substrate 11 inward of each of the common liquid chambers 13. The projection 33a has such a surface shape that the recess amount W of the dry film 17F described in the first embodiment satisfies the relationship of $W<(1-\alpha)\times Li$, more preferably, the relationship of $W=(1-\alpha)\times Li$. The temperature of the mold 33 during pressing is a softening temperature of the dry film 17F or higher (e.g., 40° C. to 80° C.), and furthermore, the pressure ranges from 0.1 MPa to 0.5 MPa, for example. This pressing enables the dry film 17F to be forcibly recessed inward of the common liquid chamber 13 (FIG. 6D).

Figure 6G:
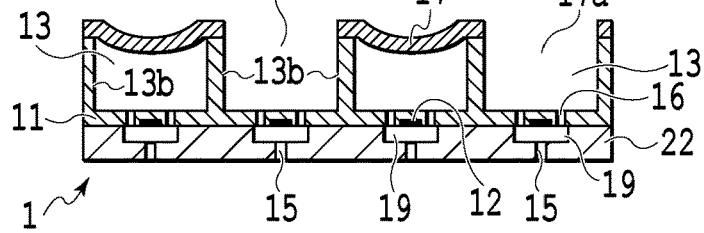

Thereafter, like in the first embodiment, after an exposing step (i.e., a second step) of exposing the substrate 11 via a mask 31 (FIG. 6E), followed by post-baking and developing (FIG. 6F), the channel forming dies 21 are removed, and then, is cured. In this manner, the liquid ejecting head 1 having the shape shown in FIG. 1 is manufactured (FIG. 6G).

In the above-described manner, in the second embodiment, the dry film 17F after tenting (i.e., the first step) is securely recessed (i.e., slacked) inward of the common liquid chambers 13 by the use of the mold 33. As a consequence, it is possible to more securely and sufficiently slack non-attached portions 17F1 in the dry film 17F, thus more securely alleviating the warp of the liquid ejecting head 1 and the warp of the substrate 11.

Figure 7A:
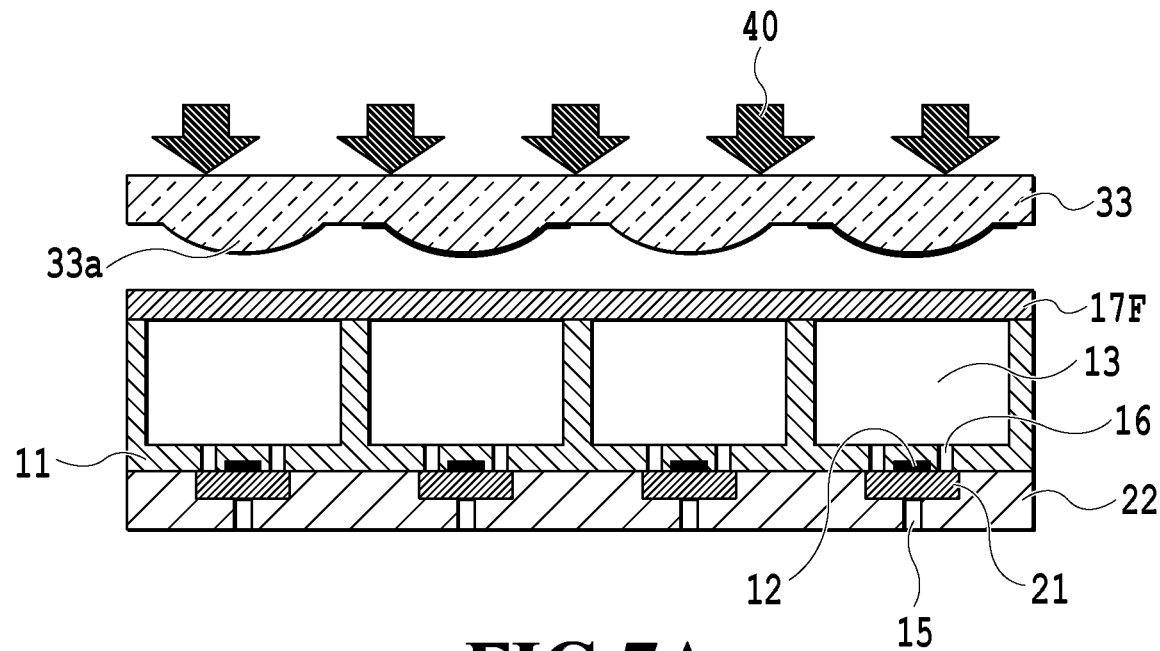
FIGS. 7A and 7B are schematic cross-sectional views showing a modification in the second embodiment of the present invention.
Figure 7B:
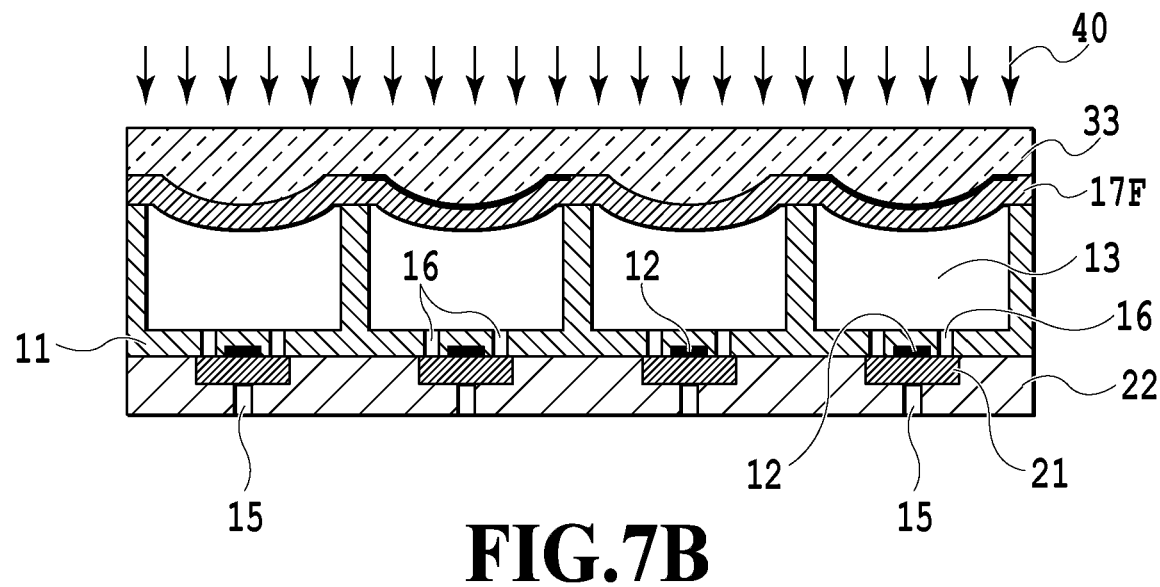

FIGS. 7A and 7B are schematic cross-sectional views showing a modification in the second embodiment of the present invention. In the embodiment shown in FIGS. 6A to 6G, the pressing for forming the slacks at the dry film 17F and the exposing step for forming the liquid inlets 17a are independently performed. In contrast, in the modification shown in FIGS. 7A and 7B, a mold serving as a mask (see FIG. 7A) having light-shielding portions partly formed thereon is prepared. Irradiation with an exposure light 40 is carried out at the same time as the pressing, so that the formation of the liquid inlets 17a and the formation of the warp of the non-stuck portions 17F1 of the dry film 17F are performed at the same time. As a consequence, with this modification, it is possible to enhance the peelability of a hardened portion by the exposure to the light beam, and furthermore, the pressing step and the exposing step to the light beam are performed at the same time, thus simplifying the manufacturing step and enhancing the controllability of an apparatus.

A manufacturing method for the liquid ejecting head of the present invention will be more specifically explained by way of Examples and Comparative Example.

EXAMPLE 1

In the present example, the liquid ejecting head 1 shown in FIG. 1 and FIG. 2 was manufactured in accordance with the following steps.

First, a first positive photosensitive resin such as ODUR-1010 (manufactured by TOKYO OHKA KOGYO CO., LTD.) was applied onto the bottom of the substrate 11 having the ejection energy generating elements 12 and a semiconductor elements for driving and controlling the ejection energy generating element 12 in a thickness of 14 μm by spin-coating. Thereafter, the first positive photosensitive resin was dried, thus forming a layer for forming the channel forming die.

Subsequently, the layer for forming the channel forming dies formed on the substrate 11 is pattern-irradiated with Deep-UV light, followed by developing with methyl isobutyl ketone by CDS-8000 and rinsing with isopropyl alcohol, thus forming the pattern 21 serving as the channel forming die.

Thereafter, a negative photosensitive resin was applied onto the bottom of the substrate 11 in 10 μm by spin-coating in such a manner as to cover the pattern 21, followed by drying, thus forming the ejection port forming member 22. A composition containing 100 mass parts of EHPE-3150 (manufactured by DAICEL CORPORATION), 5 mass parts of A-187 (manufactured by NUC Corporation), 2 mass parts of SP-170 (manufactured by ADEKA CORPORATION), and 80 mass parts of xylene was used as the negative photosensitive resin.

After exposure to an ultraviolet ray by the use of a stepper, post-baking was performed, followed by developing with a mixture solution of methyl isobutyl ketone/xylene=⅔, thus forming vacant patterns that became the ejection ports forming member 22 and the ejection ports 15 (FIG. 3A). Thereafter, in order to protect the ejection port forming member 22, the surface and periphery of the substrate were coated with a rubber resin. Moreover, the common liquid chamber 13 and the liquid supply port 16 were formed in a depth of 400 μm and a width of 200 μm by Si deep etching (FIG. 3B).

Subsequently, the substrate 11 was laminated at a stage temperature of 40° C., a roller temperature of 40° C., a roller pressure of 0.1 MPa, and a roller speed of 50 mm/s by the laminator by using a material having a hardening and shrinkage (α) of 5% such as TMMF (manufactured by TOKYO OHKA KOGYO CO., LTD.) as the dry film 17F (FIG. 3C). At that time, the initial neutral line length Li was 210 μm.

Figure 3E:
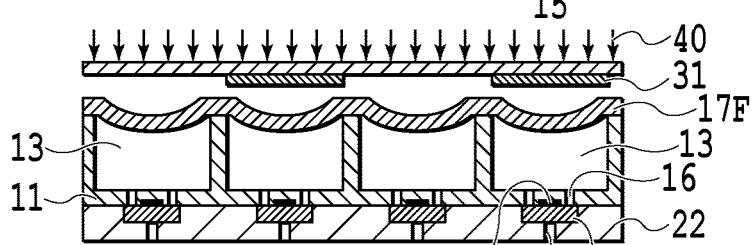
Figure 3F:
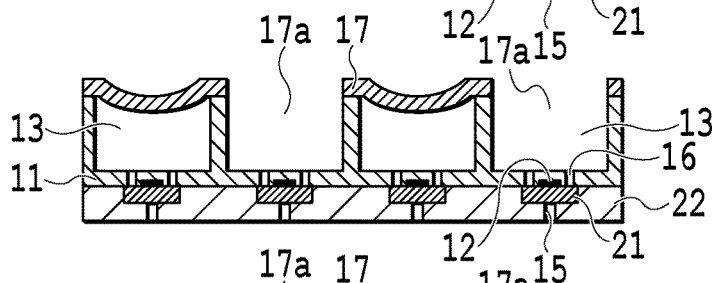
Figure 3G:
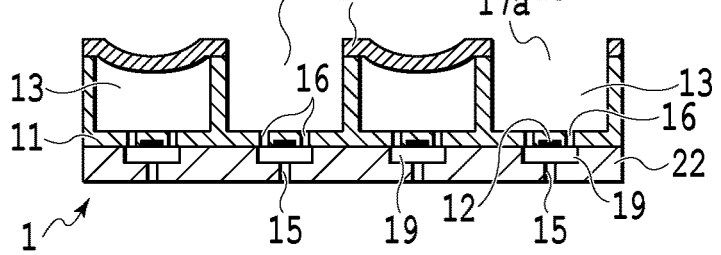

Next, the base film 18 was peeled off (FIG. 3D), followed by pattern irradiation by an i-line exposure machine capable of reverse alignment (FIG. 3E). Thereafter, post-baking was performed, followed by developing with propylene glycol 1-monomethyl ether 2-acetate, thus forming the liquid chamber covering member 17 (FIG. 3F). Subsequently, the substrate 11 was irradiated with a Deep-UV light, followed by removing dies for ink channels with methyl lactate, and then, curing was carried out at 200° C. for one hour, thus completing the fabrication of the liquid ejecting head 1 (FIG. 3G).

The liquid ejecting head 1 manufactured as described above was measured in terms of its warp and the unevenness of the tented portion (i.e., the non-stuck portion) 17F1 corresponding to the common liquid chamber 13. As a result, both of the warp of the liquid ejecting head 1 and the unevenness of the tented portion 17F1 were sufficiently small in a favorable manner.

EXAMPLE 2

Like Example 1, the steps of forming the pattern serving as the channel forming die, the ejection port forming member 22, the liquid supply port 16, and the common liquid chamber 13 were carried out (FIG. 3B).

Subsequently, the substrate 11 was laminated at a stage temperature of 40° C., a roller temperature of 40° C., a roller pressure of 0.1 MPa, and a roller speed of 10 mm/s by the laminator by using a material having a hardening and shrinkage (α) of 5% such as TMMF (manufactured by TOKYO OHKA KOGYO CO., LTD.) as the dry film 17F (FIG. 3C). At that time, the initial neutral line length Li was 215 μm.

Next, the base film 18 was peeled off (FIG. 3D), followed by pattern irradiation by an i-line exposure machine capable of reverse alignment (FIG. 3E). Thereafter, post-baking was performed, followed by developing with propylene glycol 1-monomethyl ether 2-acetate, thus forming the liquid chamber covering member 17 (FIG. 3F). Subsequently, the substrate 11 was irradiated with a Deep-UV light beam, followed by removing a die for an ink channel with methyl lactate, and then, curing was carried out at 200° C. for one hour, thus completing the fabrication of the liquid ejecting head 1 (FIG. 3G).

The liquid ejecting head 1 manufactured as described above was measured in terms of its warp and the unevenness of the tented portion (i.e., the non-stuck portion) 17F1 corresponding to the common liquid chamber 13. As a result, the warp of the liquid ejecting head 1 was sufficiently small in a favorable manner, although the unevenness of the tented portion 17F1 was slightly large.

COMPARATIVE EXAMPLE 1

Like Example 1, the steps of forming the channel forming die 21, the ejection port forming member 22, the liquid supply port 16, and the common liquid chamber 13 were carried out (FIG. 3B).

Subsequently, the substrate 11 was laminated at a stage temperature of 30° C., a roller temperature of 30° C., a roller pressure of 0.1 MPa, and a roller speed of 50 mm/s by the laminator by using a material having a hardening and shrinkage (α) of 5% such as TMMF (manufactured by TOKYO OHKA KOGYO CO., LTD.) as the dry film 17F (FIG. 3C). At that time, the initial neutral line length Li was 205 μm.

Next, the base film 18 was peeled off (FIG. 3D), followed by pattern irradiation by an i-line exposure machine capable of reverse alignment (FIG. 3E). Thereafter, post-baking was performed, followed by developing with propylene glycol 1-monomethyl ether 2-acetate, thus forming the liquid chamber covering member 17 (FIG. 3F). Subsequently, the substrate 11 was irradiated with Deep-UV light, followed by removing a die for an ink channel with methyl lactate, and then, curing was carried out at 200° C. for one hour, thus completing the fabrication of the liquid ejecting head 1 (FIG. 3G).

The liquid ejecting head 1 manufactured as described above was measured in terms of its warp and the unevenness of the tented portion (i.e., the non-stuck portion) 17F1 of the dry film 17F on the liquid chamber channel. As a result, the unevenness of the tented portion 17F1 and the warp of the liquid ejecting head 1 were larger than those in Examples 1 and 2.

(Other Embodiments)

In the above-described Embodiments and Examples, the structure manufactured by the manufacturing method of the present invention is exemplified by the liquid ejecting head shown in FIG. 1 and FIG. 2. However, the present invention is not limited to the manufacturing method for the liquid ejecting head. Specifically, the present invention is effective in every manufacturing method including the step of tenting a hole such as a through hole or a recess formed at the base such as a semiconductor substrate with a covering member such as a dry film resist, and therefore, the present invention is not limited to the manufacturing method for the liquid ejecting head.

Furthermore, the manufacturing method for the liquid ejecting head of the present invention is applicable to a manufacturing method for a liquid ejecting head that is mounted on an apparatus such as a printer, a copying machine, a facsimile, and a word processor having a printer or an industrial printing apparatus compositely combined with various processors. More specifically, the manufacturing method for the liquid ejecting head of the present invention is applicable to a manufacturing method for a liquid ejecting head that manufactures a substrate for electronic circuit printing or a device for spraying medication or a biochip.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-155167, filed Aug. 5, 2015, which is hereby incorporated by reference wherein in its entirety.

What is claimed is:

1. A manufacturing method for a structure including:
   a base having a hole in the base; and
   a dry film attached onto the base,
   the manufacturing method comprising:
   a first step of attaching the dry film having flexibility onto the base in such a manner as to cover an opening of the hole; and
   a second step of hardening the dry film attached onto the base,
   wherein in the first step, the dry film is attached onto the base so that a closed space is formed inward of the hole, and an entire non-attached portion of the dry film covering the opening is slacked inward of the hole from the opening, and
   wherein the first step is performed in an environment of a lower pressure than in the second step.

2. The manufacturing method according to claim 1, wherein:
   $W \leq (1-\alpha) \times Li$,
   wherein W represents a width of the opening; Li, a width of the entire non-attached portion of the dry film covering the opening in the first step; and α, a rate of shrinkage of the dry film hardened in the second step.

3. The manufacturing method according to claim 1, wherein in the first step, the dry film is stacked on the base, before the non-attached portion covering the opening is pressed by a pressing member, so that the non-attached portion is pushed inward of the hole.

4. A manufacturing method for a liquid ejecting head including:
   a substrate provided with an ejection energy generating element for generating energy for ejecting liquid;
   a liquid supply port;
   a liquid chamber;
   a channel communicating with the liquid supply port; and
   an ejection port forming member having an ejection port communicating with the channel formed on the ejection port forming member,
   the manufacturing method comprising:
   a first step of attaching a dry film having flexibility onto the substrate in such a manner as to cover an opening of the liquid chamber; and
   a second step of hardening the dry film attached onto the substrate, wherein in the first step, the dry film is attached onto the substrate so that a closed space is formed inward of the liquid chamber, and an entire non-attached portion of the dry film covering the opening is slacked inward of the liquid chamber from the opening, and wherein the first step is performed in an environment of a lower pressure than in the second step.

5. The manufacturing method according to claim 4, wherein:

$$W \leq (1-\alpha) \times Li,$$

wherein W represents a width of the opening; Li, a width of the entire non-attached portion of the dry film covering the opening in the first step; and α, rate of the shrinkage of the dry film hardened in the second step.

6. The manufacturing method according to claim 4, further comprising exposing and developing the dry film attached onto the substrate in the second step so as to form, at a part of the dry film, a liquid inlet communicating with the liquid chamber.

7. The manufacturing method according to claim 6, wherein a base film is attached onto the dry film for use in the first step, the base film being peeled off before the exposing and developing in the second step.

8. The manufacturing method according to claim 4, wherein in the first step, the dry film is stacked on the substrate, before the non-attached portion covering the opening is pushed inward of the liquid chamber by a pressing member.

\* \* \* \* \*